(12) United States Patent
Jin et al.

(10) Patent No.: US 11,901,467 B2
(45) Date of Patent: *Feb. 13, 2024

(54) SOLAR CELL

(71) Applicants: ZHEJIANG JINKO SOLAR CO., LTD., Zhejiang (CN); JINKO SOLAR CO., LTD., Jiangxi (CN)

(72) Inventors: Jingsheng Jin, Zhejiang (CN); Xinyu Zhang, Zhejiang (CN); Nannan Yang, Zhejiang (CN)

(73) Assignees: ZHEJIANG JINKO SOLAR CO., LTD., Haining (CN); JINKO SOLAR CO., LTD., Jiangxi (CN)

( * ) Notice: Subject to any disclaimer, the term of this patent is extended or adjusted under 35 U.S.C. 154(b) by 25 days.

This patent is subject to a terminal disclaimer.

(21) Appl. No.: 17/390,848

(22) Filed: Jul. 30, 2021

(65) Prior Publication Data

US 2022/0140160 A1 May 5, 2022

Related U.S. Application Data

(63) Continuation of application No. 17/106,062, filed on Nov. 27, 2020.

(30) Foreign Application Priority Data

Oct. 30, 2020 (CN) .......................... 202011192543.X

(51) Int. Cl.
*H01L 31/0224* (2006.01)
*H01L 21/02* (2006.01)
(Continued)

(52) U.S. Cl.
CPC ................ *H01L 31/022425* (2013.01); *H01L 21/02057* (2013.01); *H01L 21/0262* (2013.01); *H01L 31/02168* (2013.01); *H01L 31/0392* (2013.01)

(58) Field of Classification Search
CPC ......... H01L 31/0224; H01L 31/022425; H01L 31/022441; H01L 31/022458; H01L 31/0682
See application file for complete search history.

(56) References Cited

U.S. PATENT DOCUMENTS

| 2004/0075154 A1* | 4/2004 | Nakaji .................. H01L 31/105 257/458 |
| 2013/0255765 A1* | 10/2013 | Gee ........................ H01L 31/032 438/93 |

(Continued)

FOREIGN PATENT DOCUMENTS

| CN | 105244389 A | 1/2016 |
| CN | 105304749 A | 2/2016 |

(Continued)

OTHER PUBLICATIONS

Machine Translation of KR 2016-0029501; accessed and printed Jan. 24, 2023 (Year: 2016).*

(Continued)

*Primary Examiner* — Lindsey A Buck

(57) ABSTRACT

Disclosed is a solar cell, including: a substrate; an emitter, a first passivation film, an antireflection film and a first electrode sequentially disposed on an upper surface of the substrate; a tunneling layer, a retardation layer, a field passivation layer, a second passivation film and a second electrode sequentially disposed on a lower surface of the substrate. The retardation layer is configured to retard a migration of a doped ion in the field passivation layer to the substrate. The retardation layer includes a first retardation sub-layer overlapping with a projection of the second electrode and a second retardation sub-layer misaligning with a projection of the second electrode, and at least the second retardation sub-layer is an intrinsic semiconductor. A thickness of the first retardation sub-layer is smaller than a (Continued)

thickness of the second retardation sub-layer in a direction perpendicular to the surface of the substrate.

15 Claims, 5 Drawing Sheets

(51) Int. Cl.
*H01L 31/0216* (2014.01)
*H01L 31/0392* (2006.01)

(56) References Cited

U.S. PATENT DOCUMENTS

| | | |
|---|---|---|
| 2018/0138331 A1 | 5/2018 | Lee et al. |
| 2019/0326456 A1 | 10/2019 | Ha et al. |

FOREIGN PATENT DOCUMENTS

| | | |
|---|---|---|
| CN | 107195699 A | 9/2017 |
| CN | 209199953 U | 8/2019 |
| CN | 110473926 A | 11/2019 |
| CN | 110634996 A | 12/2019 |
| CN | 110828585 A | 2/2020 |
| CN | 111326606 A | 6/2020 |
| CN | 210926046 U | 7/2020 |
| CN | 111599895 A | 8/2020 |
| JP | 2010177264 A | 8/2010 |
| JP | 5019397 B2 | 9/2012 |
| JP | 2015-233142 A | 12/2015 |
| JP | 2016-92425 A | 5/2016 |
| KR | 2016-0029501 A | 3/2016 |
| KR | 20160052271 A | 5/2016 |
| WO | 2017/163498 A1 | 9/2017 |
| WO | 2019/021545 A1 | 1/2019 |
| WO | 2020107887 A1 | 6/2020 |

OTHER PUBLICATIONS

Zhejiang Jinko Solar Co., Ltd. et al., CN First Office Action, CN202011192543.X, dated Aug. 18, 2021, 18 pgs.

Zhejiang Jinko Solar Co., Ltd. et al., Extended European Search Report, EP20208894.4, dated May 14, 2021, 8 pgs.

Zhejiang Jinko Solar Co., Ltd. et al., AU First Office Action, AU 2020277115, dated Apr. 30, 2021, 8 pgs.

Chen, Yifeng, et al., "Mass production of industrial tunnel oxide passivated contacts (i-TOPCon) silicon solar cells with average efficiency over 23% and modules over 345 W," Progress in Photovoltaics: Research and Applications, vol. 27, No. 10, Jul. 31, 2019, 8 pgs.

Kang, Jingxuan, et al., "Intrinsic Silicon Buffer Layer Improves Hole-Collecting Poly-Si Passivating Contact," Advanced Materials Interfaces, vol. 7, No. 13, May 11, 2020, 7 pgs.

Messmer, Christoph, et al., "Efficiency Roadmap for Evolutionary Upgrades of PERC Solar Cells by TOPCon: Impact of Parasitic Absorption," IEEE Journal of Photovoltaics, vol. 10, No. 2, Dec. 19, 2019, 8 pgs.

Nogay, Gizem, et al., "Silicon-Rich Silicon Carbide Hole-Selective Rear Contacts for Crystalline-Silicon-Based Solar Cells," Applied Materials & Interfaces, vol. 8, No. 51, Dec. 28, 2016, 8 pgs.

* cited by examiner

SOLAR CELL

CROSS-REFERENCE TO RELATED APPLICATION

The present application is a continuation of U.S. patent application Ser. No. 17/106,062, filed on Nov. 27, 2020, and claims the benefit of priority to Chinese Patent Application No. 202011192543.X filed on Oct. 30, 2020, which is incorporated herein by reference in its entirety.

TECHNICAL FIELD

Embodiments of the present disclosure relate to a photovoltaic technique, in particular to a solar cell.

BACKGROUND

With the continuous development of the solar cell technology, a recombination loss of a metal contact area has become one of important factors restricting further improvement of conversion efficiency of a solar cell. In order to improve a conversion rate of a solar cell, the solar cell is usually passivated by a passivated contact in order to reduce the recombination inside and on the surface of the solar cell. Existing passivated contact cells include a heterojunction with intrinsic thin-layer (HIT) cell and a tunnel oxide passivated contact (TOPCon) cell. However, the troubles of the recombination loss for the existing passivated contact cells may cause a negative impact on the improvement of conversion efficiency.

SUMMARY

Some embodiments of the present disclosure provide a solar cell, which is beneficial to reduce a recombination loss of the solar cell and improve a conversion efficiency of the solar cell.

In order to solve the above problems, the present disclosure provides a solar cell, including: a substrate; an emitter, a first passivation film, an antireflection film and a first electrode that are sequentially disposed on an upper surface of the substrate; a tunneling layer, a retardation layer, a field passivation layer, a second passivation film and a second electrode that are sequentially disposed on a lower surface of the substrate. The retardation layer is configured to retard a migration of a doped ion in the field passivation layer to the substrate, and the retardation layer includes a first retardation sub-layer overlapping with a projection of the second electrode and a second retardation sub-layer misaligning with a projection of the second electrode, and at least the second retardation sub-layer is configured as an intrinsic semiconductor layer. A thickness of the first retardation sub-layer is smaller than a thickness of the second retardation sub-layer in a direction perpendicular to the surface of the substrate.

In some embodiments, a surface of the first retardation sub-layer away from the substrate is flush with a surface of the second retardation sub-layer away from the substrate.

In some embodiments, a surface of the first retardation sub-layer towards the substrate is flush with a surface of the second retardation sub-layer towards the substrate.

In some embodiments, a thickness of the retardation layer is less than or equal to 20 nm in the direction perpendicular to the surface of the substrate. In this way, it is beneficial to avoid the retardation layer from greatly retarding a transmission of a majority carrier, and ensure that the majority carrier may be effectively transmitted. Further, it is also beneficial to avoid too much weakening of a band bending effect of the field passivation layer due to an increase of a distance between the field passivation layer and the substrate, thus maintaining a selective transmission of the carrier, and improving an open circuit voltage and a conversion efficiency of the solar cell.

In some embodiments, a material of the intrinsic semiconductor layer is the same as a material of the field passivation layer.

In some embodiments, an average doping concentration of a surface layer of the field passivation layer toward the retardation layer is $1E+19/cm3-1E+21/cm3$, and the thickness of the second retardation sub-layer is 0.5 nm-20 nm. In this way, it is beneficial to prevent the doped ion in the field passivation layer from migrating to the surface of the substrate during a short thermal diffusion, thereby reducing a recombination loss on the surface of the substrate.

In some embodiments, a surface doping concentration of a surface of the field passivation layer away from the retardation layer is $1E+20/cm3-1E+22/cm3$, and a ratio of the thickness of the field passivation layer to the thickness of the second retardation sub-layer in the direction perpendicular to the surface of the substrate is 5-100. In this way, it is beneficial to prevent the doped ion in the field passivation layer from migrating to the surface of the substrate during a complete thermal diffusion, thereby reducing a recombination loss on the surface of the substrate. Further, it is beneficial to ensure that a good ohmic contact may be formed between the field passivation layer and the electrode, thereby ensuring the effective transmission of the majority carrier.

In some embodiments, a material type of the first retardation sub-layer is different from a material type of the field passivation layer.

In some embodiments, the first retardation sub-layer is the intrinsic semiconductor.

In some embodiments, the material type of the retardation layer includes at least one of a metal oxide, a silicide, a salt, an organic compound or a metal.

In some embodiments, the retardation layer has a multilayer structure. A plurality of film layers in the multilayer structure are sequentially disposed in the direction perpendicular to the surface of the substrate, and materials of different film layers are the same or different.

The present disclosure further provides a method for preparing a solar cell, including: providing a substrate; forming an emitter, a first passivation film, an antireflection film and a first electrode sequentially on an upper surface of the substrate; forming a tunneling layer, a retardation layer, a field passivation layer, a second passivation film and a second electrode sequentially on a lower surface of the substrate; wherein the retardation layer is configured to retard a migration of a doped ion in the field passivation layer to the substrate, and the retardation layer comprises: a first retardation sub-layer overlapping with a projection of the second electrode, and a second retardation sub-layer misaligning with a projection of the second electrode, and at least the second retardation sub-layer being configured as an intrinsic semiconductor layer; wherein a thickness of the first retardation sub-layer is smaller than a thickness of the second retardation sub-layer in a direction perpendicular to the surface of the substrate.

In some embodiments, the substrate comprises a first region and a second region; the first region overlaps with a projection of the second electrode, and the second region misaligns with a projection of the second electrode. The forming the tunneling layer, the retardation layer, the field passivation layer, the second passivation film and the second electrode sequentially on the lower surface of the substrate includes: forming a tunneling film on the lower surface of the substrate, preferably by a thermal oxidation process; etching the tunneling film to form the tunneling layer, such that a thickness of the tunneling layer above the first region is greater than a thickness of the tunneling layer above the second region; forming a retardation film on the tunneling layer, preferably by a chemical vapor deposition process; and performing a planarization process on the retardation film to form the retardation layer above the lower surface of the substrate; forming a polycrystalline silicon layer on the retardation layer, preferably by a chemical vapor deposition process; and performing an ion implantation process on the polycrystalline silicon layer to form the field passivation layer above the lower surface of the substrate; forming the second passivation film and the second electrode sequentially on the field passivation layer.

In some embodiments, the substrate comprises a first region and a second region; the first region overlaps with a projection of the second electrode, and the second region misaligns with a projection of the second electrode. The forming the tunneling layer, the retardation layer, the field passivation layer, the second passivation film and the second electrode sequentially on the lower surface of the substrate includes: forming a tunneling layer on the lower surface of the substrate, preferably by a thermal oxidation process, such that the tunneling layer has a uniform thickness in a direction perpendicular to the lower surface of the substrate; forming a retardation film on the tunneling layer, preferably by a chemical vapor deposition process; patterning and etching the retardation film, such that a thickness of the retardation film above a first region is smaller than a thickness of the retardation film above a second region; and serving the remaining retardation film as the retardation layer; forming a polycrystalline silicon layer on the retardation layer, preferably by a chemical vapor deposition process; and performing a planarization process on the polycrystalline silicon layer such that the polycrystalline silicon layer has a flush surface far away from the substrate; etching the polycrystalline silicon layer with a mask, such that a thickness of the polycrystalline silicon layer above the first region is the same as a thickness of the polycrystalline silicon layer above the second region; and performing an ion implantation process on a surface layer of the polycrystalline silicon layer away from the substrate, to form the field passivation layer above the lower surface of the substrate; forming the second passivation film and the second electrode sequentially on the field passivation layer.

In some embodiments, the forming the emitter, the first passivation film, the antireflection film and the first electrode sequentially on the upper surface of the substrate includes: performing diffusion of doped ion on the upper surface of the substrate to form the emitter, before forming the tunneling film; removing an oxide layer, a retardation film and a polycrystalline silicon layer on the upper surface of the substrate, after forming the field passivation layer; and forming the first passivation film, the antireflection film and the first electrode sequentially on the upper surface of the substrate.

Compared with the existing technology, the technical solution provided by the embodiments of the present disclosure has the following advantages:

In the above technical solutions, an arrangement of the retardation layer is beneficial to ensure that there is a large potential barrier between the field passivation layer and the substrate, so that the field passivation layer has a good band bending effect, thereby maintaining the selective transmission of the carrier, and also contributing to reducing the recombination loss caused by the migration of the doped ion to the surface of the substrate. Further, when a natural diffusion occurs due to a concentration difference, the second retardation sub-layer may bear the doped ion in the corresponding field passivation layer, thereby diluting the doping concentration of the corresponding part of the field passivation layer, further weakening a light absorption capacity of the corresponding part of the field passivation layer and improving a photoelectric conversion efficiency of the solar cell. Besides, the doped ion diffused into the second retardation sub-layer may enhance the band bending effect and maintain the selective transmission of the carrier.

BRIEF DESCRIPTION OF THE DRAWINGS

One or more embodiments are described as examples with reference to the corresponding figures in the accompanying drawings, and the examples do not constitute a limitation to the embodiments. The figures in the accompanying drawings do not constitute a proportion limitation unless otherwise stated.

DETAILED DESCRIPTION

Figure 1:
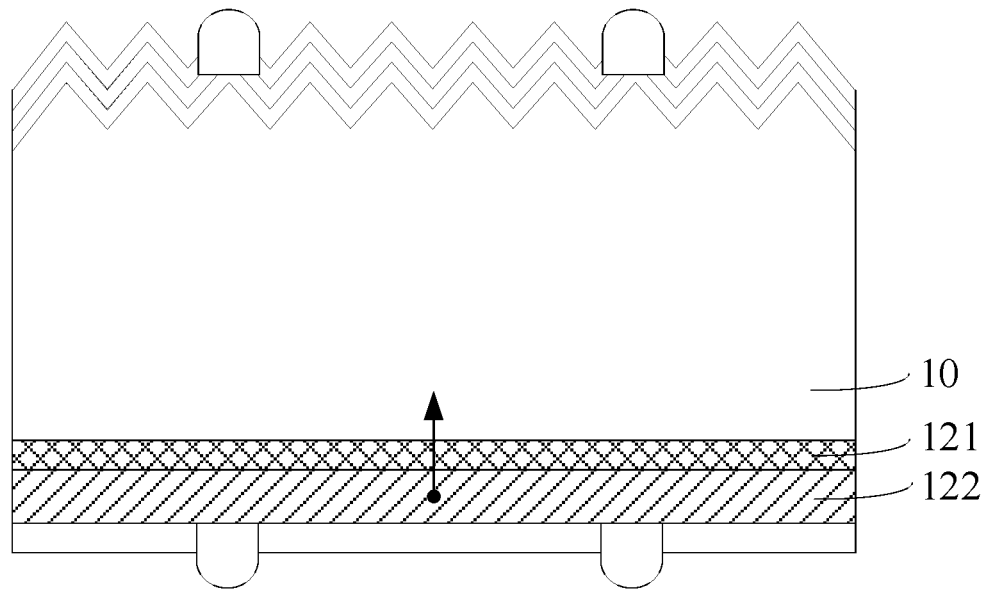
FIG. 1 is a schematic structural diagram of a solar cell.

Referring to FIG. 1, FIG. 1 is a schematic structural diagram of a TOPCon cell.

The TOPCon cell includes a substrate 10 and a passivated contact structure covering a lower surface of the substrate 10. The passivated contact structure includes a tunneling layer 121 and a field passivation layer 122 disposed in sequence. The tunneling layer 121 is configured to chemically passivate a surface of the substrate 10 and reduce an interface state. The field passivation layer 122 is configured to form a band bending on the surface of the substrate 10, realize a selective transmission of a carrier and reduce a recombination loss. In some embodiments, the field passivation layer 122 may be configured as a polycrystalline silicon layer doped with a doped ion.

In the process of preparing the passivated contact structure and a post-treatment process of a finished cell, a high-temperature heat treatment provides a thermodynamic force for the doped ion in the field passivation layer 122, which leads to the doped ion penetrating through the tunneling layer 121 and migrating to the lower surface of the substrate 10, thereby increasing a surface recombination of the lower surface of the substrate 10 and reducing an interface passivation effect of the tunneling layer 121. Moreover, the migration of the doped ion shall further cause a potential barrier between the substrate 10 and the field passivation layer 122 to decrease, thus weakening a field passivation effect of the field passivation layer 122 and further reducing a conversion efficiency of the solar cell.

In order to solve the above problems, an embodiment of the present disclosure provides a solar cell. An arrangement of a retardation layer is beneficial to ensure that there is a large potential barrier between a field passivation layer and a substrate, so that the field passivation layer has a good band bending effect, thereby maintaining a selective transmission of a carrier, and also contributing to reducing a recombination loss caused by a migration of a doped ion to a surface of the substrate. Further, when a natural diffusion occurs due to a concentration difference, a second retardation sub-layer may bear the doped ion in the corresponding field passivation layer, thereby diluting a doping concentration of a corresponding part of the field passivation layer, further weakening a light absorption capacity of the corresponding part of the field passivation layer and improving a photoelectric conversion efficiency of the solar cell. Moreover, the doped ion diffused into the second retardation sub-layer may enhance the band bending effect and maintain the selective transmission of the carrier.

The embodiments of the present disclosure will be described in detail below with reference to the accompanying drawings in order to make the objectives, technical solutions and advantages of the present disclosure clearer. However, those skilled in the art may appreciate that, in the various embodiments of the present disclosure, numerous technical details are set forth in order to provide the reader with a better understanding of the present disclosure. However, the technical solutions claimed in the present disclosure may be implemented without these technical details and various changes and modifications based on the following embodiments.

Figure 2:
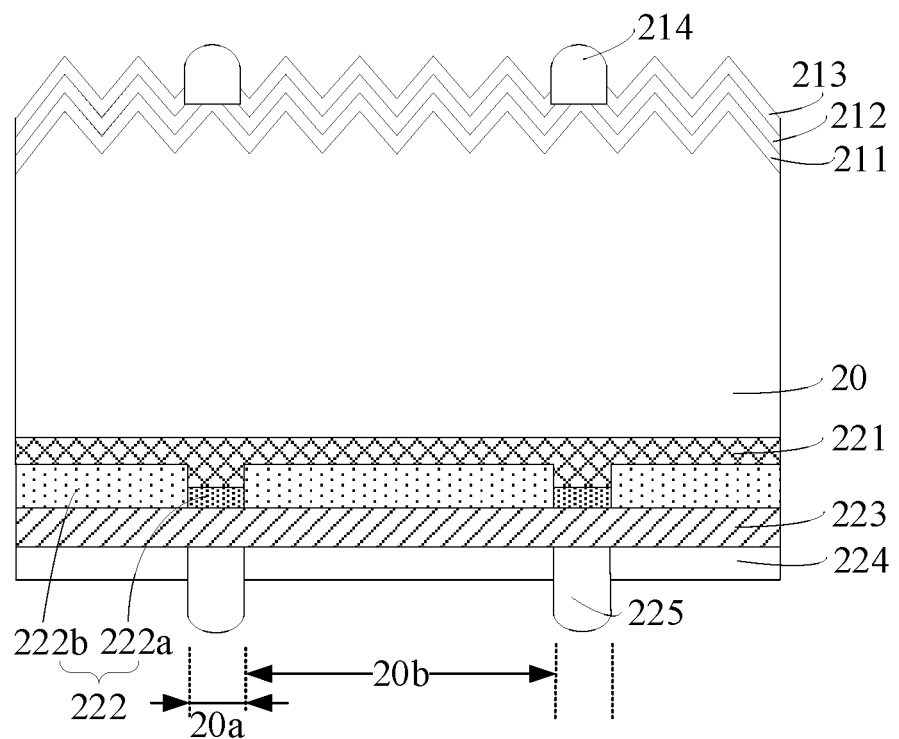
FIG. 2 is a schematic structural diagram of a solar cell according to an embodiment of the present disclosure.

FIG. 2 is a schematic structural diagram of a solar cell provided in an embodiment of the present disclosure. In order to simplify the expression, a majority carrier is referred to as a major and a minority carrier is referred to as a minor.

Referring to FIG. 2, the solar cell includes: a substrate 20; an emitter 211, a first passivation film 212, an antireflection film 213 and a first electrode 214 that are sequentially disposed on an upper surface of the substrate 20; a tunneling layer 221, a retardation layer 222, a field passivation layer 223, a second passivation film 224 and a second electrode 225 that are sequentially disposed on a lower surface of the substrate 20. The retardation layer 222 is configured to retard a migration of a doped ion in the field passivation layer 223 to the substrate 20, and the retardation layer 222 includes a first retardation sub-layer 222a overlapping with a projection of the second electrode 225 and a second retardation sub-layer 222b misaligning with a projection of the second electrode, and at least the second retardation sub-layer 222b is an intrinsic semiconductor. A thickness of the first retardation sub-layer 222a is smaller than a thickness of the second retardation sub-layer 222b in a direction perpendicular to the surface of the substrate 20. In an example, a surface of the first retardation sub-layer 222a away from the substrate 20 is flush with a surface of the second retardation sub-layer 222b away from the substrate 20.

The substrate 20 and the emitter 211 form a PN junction. Specifically, if the substrate 20 is P-type, the emitter 211 can be N-type; and if the substrate 20 is N-type, the emitter can be P-type. Optionally, a material of the substrate 20 may include a semiconductor material such as a monocrystalline silicon, a polycrystalline silicon, a monocrystalline-like silicon, a perovskite, etc.

The materials of the first passivation film 212 and the second passivation film 224 include one or more materials such as a silicon nitride, a silicon oxynitride, a silicon carbonitride, a titanium oxide, a hafnium oxide, an aluminum oxide, etc. The material of the antireflection film 213 may include one or more materials such as the silicon nitride, the silicon oxynitride, the silicon carbonitride, etc. The first electrode 214 penetrates through the antireflection film 213 and the first passivation film 212 and is connected with the emitter 211. The second electrode 225 penetrates through the second passivation film 224 and is in contact with the field passivation layer 223. The first electrode 214 may be a silver-aluminum electrode, and the second electrode 225 may be a silver electrode.

In this embodiment, a retardation capability of the retardation layer 222 is defined by a longest distance that the doped ion that undergoes a thermal diffusion may migrate in a direction of the field passivation layer 223 towards the substrate 20. The shorter the longest distance that the doped ion may migrate, the stronger the retardation capability of the retardation layer 222. The longer the longest distance that the doped ion may migrate, the weaker the retardation capability of the retardation layer 222.

In this embodiment, the substrate 20 includes a first region 20a and a second region 20b. The field passivation layer 223 above the first region 20a is configured to contact with the second electrode 225. The retardation layer 222 above the first region 20a is referred to as the first retardation sub-layer 222a, and the retardation layer 222 above the second region 20b is referred to as the second retardation sub-layer 222b. The first retardation sub-layer 222a being overlapped with the projection of the second electrode 225 means that an orthographic projection of the second electrode 225 overlaps with the orthographic projection of the first retardation sub-layer 222a in the direction perpendicular to the surface of the substrate 20. In other words, the orthographic projection of the retardation layer 222a is located within the orthographic projection of the second electrode 225. In other words, an extension of the second electrode 225 intersects with the first retardation sub-layer 222a. The second retardation sub-layer 222b being misaligned with the projection of the second electrode means that the orthographic projection of the second retardation sub-layer 222b misaligns with the orthographic projection of the second electrode 225 in the direction perpendicular to the surface of the substrate 20. In other words, the extension of the second electrode 225 does not intersect with the second retardation sub-layer 222b.

In this embodiment, the retardation capability of the second retardation sub-layer 222b is weaker than the retardation capability of the first retardation sub-layer 222a. Specifically, when the doped ion in the field passivation layer 223 undergoes the thermal diffusion, a longest distance that the doped ion retarded by the second retardation sub-layer 222b may move is greater than a longest distance that the doped ion retarded by the first retardation sub-layer 222a may move.

The retardation layer may achieve its retardation effect in two manners: first, an interface retardation, that is, the doped ion in a specific film layer may not or may be difficult to pass through an interface between the specific film layer and the retardation layer; Secondly, a buffer retardation, that is, the doped ion in the specific film layer may diffuse into the retardation layer due to a drive of a concentration difference, but since the diffusion shall decrease a concentration gradient, the doped ion shall eventually be unable to continue to diffuse because a diffusion force is too small due to the small concentration gradient, thus achieving the retardation effect.

In this embodiment, in the direction perpendicular to the surface of the substrate 20, the thickness of the retardation layer 222 is less than or equal to 20 nm, for example, 5 nm, 10 nm or 15 nm. In this way, it is beneficial to avoid that the thickness of the retardation layer 222 is large, which may cause a large retardation to the transmission of the majority carrier, and ensure that the majority carrier may be effectively transmitted. Further, it is also beneficial to avoid too much weakening of a band bending effect of the field passivation layer 223 due to an increase of a distance between the field passivation layer 223 and the substrate 20, thus maintaining a selective transmission of the carrier, and improving an open circuit voltage and a conversion efficiency of the solar cell.

In this embodiment, at least the second retardation sub-layer 222b is configured as an intrinsic semiconductor layer, and the second retardation sub-layer 222b achieves the retardation effect through the buffer retardation. When the second retardation sub-layer 222b is the intrinsic semiconductor layer, the doped ion in the field passivation layer 223 may migrate into the second retardation sub-layer 222b by diffusion. Since the second retardation sub-layer 222b is closer to the substrate 20 than the field passivation layer 223, the doped ion migrated into the second retardation sub-layer 222b may compensate for the band bending effect of the field passivation layer 223, thus avoiding an excessive reduction of the band bending of the field passivation layer 223 caused by the increase of the distance between the field passivation layer 223 and the substrate 20, which is conductive to maintaining the selective transmission of the carrier. In addition, the migration of the doped ion may ensure that the second retardation sub-layer 222b has a high conductivity, which is beneficial to ensure the effective transmission of the majority carrier. In addition, the doped ion in the field passivation layer 223 migrates into the second retardation sub-layer 222b, which is beneficial to decrease an ion doping concentration of the field passivation layer 223 above the second region 20b, thereby decreasing a light absorption coefficient of the field passivation layer 223 above the second region 20b and improving the conversion efficiency of the solar cell.

A material of the intrinsic semiconductor layer may include an intrinsic polycrystalline silicon, an intrinsic amorphous silicon or an intrinsic microcrystalline silicon, and the material of the intrinsic semiconductor layer may be the same as the material of the field passivation layer 223. It should be noted that the material of the field passivation layer 223 here refers to an intrinsic material of the field passivation layer 223 before doping with the doped ion, or a base material of the doped ion.

In this embodiment, the material of the second retardation sub-layer 222b may be the same as the material of the field passivation layer 223, which is beneficial to reduce the manufacturing process steps of the solar cell and ensure the effective transmission of the majority carrier. In other embodiments, the material of the second retardation sub-layer and the material of the field passivation layer may belong to different materials in the same material type. For example, the field passivation layer is the polycrystalline silicon and the second retardation sub-layer is the amorphous silicon. In this way, besides ensuring the effective transmission of the majority carrier, the interface between the second retardation sub-layer and the field passivation layer may be used to weaken a thermal diffusion energy of the doped ion, thereby preventing the doped ion from continuing to migrate after diffusing to the second retardation sub-layer 222b, thus ensuring that the tunneling layer 221 has a good interface passivation effect and the solar cell has a small recombination loss.

It should be noted that a retardation capability of the interface between adjacent film layers to the doped ion is related to an interfacial energy of the interface. The larger the interfacial energy, the stronger the retardation capability. The smaller the interfacial energy, the weaker the retardation capability. The interfacial energy is related to the materials of the adjacent film layers. The interfacial energy between different materials in the same type is small, such as the polycrystalline silicon and the microcrystalline silicon, while the interfacial energy between different types of materials is strong, such as the polycrystalline silicon and metal compounds, the polycrystalline silicon and salts, and the polycrystalline silicon and organic compounds.

In this embodiment, an average doping concentration of a surface layer of the field passivation layer 223 towards the retardation layer 222 is $1E+19/cm^3 \sim 1E+21/cm^3$, for example, $5E+19/cm^3$, $1E+20/cm^3$ or $5E+20/cm^3$, and the thickness of the second retardation sub-layer 222b is 0.5 nm-20 nm, for example, 1 nm, 5 nm or 10 nm. In this way, when a duration of the high-temperature heat treatment is short, the doped ion in the field passivation layer 223 does not have enough thermodynamic force and diffusion force to migrate to the surface of the substrate 20, which is conducive to reducing the recombination loss of the surface of the substrate 20.

Herein, a type of the doped ion of the field passivation layer 223 is the same as a type of the doped ion of the substrate 20. Specifically, if the substrate 20 is an N-type silicon wafer, the field passivation layer 223 can be doped with N-type doped ions, and the doped ion includes a phosphorus ion. If the substrate 20 is a P-type silicon wafer, the field passivation layer 223 can be doped with P-type doped ions, and the doped ion includes a boron ion.

In this embodiment, a surface doping concentration of a surface of the field passivation layer 223 away from the retardation layer 222 is $1E+20/cm^3 - 1E+22/cm^3$, for example, $5E+20/cm^3$, $1E+21/cm^3$ or $5E+21/cm^3$. A ratio of the thickness of the field passivation layer 223 to the thickness of the second retardation sub-layer 222b in the direction perpendicular to the surface of the substrate 20 is 5-100, for example, 10, 20, 50, or 70. Since the second electrode 225 is generally in contact with the surface of the field passivation layer 223 away from the substrate 20, adopting the above surface doping concentration is conducive to ensuring a good ohmic contact between the field passivation layer 223 and the second electrode 225 and reducing the transmission loss of the majority carrier. Moreover, adopting the above thickness ratio is beneficial to ensure that a small concentration gradient may be formed between the field passivation layer 223 and the second retardation sub-layer 222b when the doped ion in the surface of the field passivation layer 223 undergoes a complete thermal diffusion. That is, the surface layer of the second retardation sub-layer 222b close to the substrate 20 has a low doping concentration. In this way, the doped ion is not easy to further diffuse to the surface of the substrate 20 after losing the diffusion force due to the concentration difference, which is beneficial to reduce the recombination loss of the surface of the substrate 20 and ensuring the interface passivation effect of the tunneling layer 221, thereby improving the conversion efficiency of the solar cell.

In this embodiment, a material type of the first retardation sub-layer 222a is different from a material type of the field passivation layer 223. By controlling the material type of the first retardation sub-layer 222a to be different from the material type of the field passivation layer 223, it is beneficial to enable the first retardation sub-layer 222a to realize the interface retardation, ensure that the field passivation layer 223 above the first region 20a has a relative high average doping concentration, and ensure that the surface of the field passivation layer 223 above the first region 20a away from the substrate 20 has a relative high surface doping concentration, so that the field passivation layer 223 above the first region 20a forms a good ohmic contact with the second electrode 225, thus enabling the effective transmission of the majority carrier, that is, the solar cell has the high conversion efficiency.

Herein, the material type of the first retardation sub-layer 222a includes at least one of a metal oxide, a silicide, a salt, an organic compound or a metal. Specifically, the metal oxide includes $TiO_x$, $MoO_x$, $Vo_x$, $Wo_x$ or $MgO_x$, the silicide includes SiC, $SiN_x$, $SiO_xN_y$ or $SiO_xN_yC_z$, the salt includes $MgF_x$, $CsF_x$ or $LiF_x$, and the organic compound includes Poly(3,4-ethylenedioxythiophene/poly(styrenesulfonate) (PEDOT/PSS), and the metal includes Mg, Ca or Al. It should be noted that the selection of the metal is related to the doping type and the doping concentration of the substrate 20, that is, the first retardation sub-layer 222a may match a corresponding work function according to the doping type and the doping concentration of the substrate 20.

In this embodiment, the first retardation sub-layer 222a has a multilayer structure. A plurality of film layers in the multilayer structure are disposed in the direction perpendicular to the surface of the substrate 20, and materials of different film layers are the same or different. Further, a single film layer may be composed of a single material including the metal oxide, the silicide, the salt, the organic compound or the metal. The single film layer may also be composed of multiple materials, so as to achieve a better controllability or better performance of the retardation effect. Herein, the controllability refers to a large adjustable range and a high adjustment accuracy of the retardation effect.

Specifically, the first retardation sub-layer 222a may include at least two film layers, and each of the film layers is composed of a single material. Further, the two film layers include a first surface layer of the first retardation sub-layer 222a toward the tunneling layer 221 and a second surface layer of the first retardation sub-layer 222a toward the field passivation layer 223, and a material of the first surface layer is different from a material of the second surface layer, which is beneficial to enable a performance of an interface between the first retardation sub-layer 222a and any adjacent film layer meet a preset requirement. It should be noted that the performance of the interface between adjacent film layers is related to the material of the surface layer of adjacent film layers toward the interface.

Specifically, the material of the second surface layer may be adjusted according to the material of the field passivation layer 223, so that the first retardation sub-layer 222a has a good interfacial retardation effect. Moreover, the material of the first surface layer may be adjusted according to the material of the tunneling layer 221, so as to ensure that the majority carrier may effectively pass through an interface between the first retardation sub-layer 222a and the tunneling layer 221.

For example, the material of the first surface layer may be the same as the material of the tunneling layer 221, which is specifically an oxide. The material of the second surface layer may be the metal oxide, which may retard the doped ion.

In addition, the material of the second film layer may be obtained by performing a preset treatment process on the material of the first film layer. In this way, it is beneficial to reduce the process difficulty as well as the material waste.

For example, the material of the first surface layer may be a specific metal, and the material of the second surface layer may be a metal compound generated by a specific metal reaction. The metal compound includes a metal oxide obtained by oxidizing a metal, and a metal nitride obtained by a nitrogen bombardment of the metal, etc.

It should be noted that processes such as the oxidation and the nitrogen bombardment may be performed not only after a first metal material is deposited on the surface of the tunneling layer 221, but may also be performed during a deposition process, that is, another process is performed simultaneously after the deposition process is performed for a preset time, so as to treat the metal material being deposited.

The retardation layer 222 may be prepared by a chemical vapor deposition process, a physical vapor deposition process, an atomic layer deposition process, a sputtering process, an evaporation process, an electroless plating process, an electroplating process, a printing process, a sol-gel process, or the like, and any combinations thereof.

The specific selection of the formation process of the retardation layer 222 is related to the thickness of the retardation layer 222, a morphological characteristic of a formation position and a process time requirement of the retardation layer 222. Specifically, when the thickness of the retardation layer 222 is relative thin, the atomic layer deposition process may be selected, so that the retardation layer 222 have a good compactness, which ensures that the retardation layer 222 has a good interfacial retardation effect. When the thickness of the retardation layer 222 is relative thick, a low-pressure chemical vapor deposition process or a plasma-enhanced chemical vapor deposition process may be selected, so that the retardation layer 222 has a short process time, and the retardation layer 222 is prevented from being polluted by impurities during the formation process, which ensures that the retardation layer 222 has a preset performance.

It should be noted that the retardation layer 222 may be formed by two or more types of processes. Specifically, when the formation position of the retardation layer 222 has a stepped topography, the atomic layer deposition process may be adopted firstly to form a first sub-film layer covering the stepped topography, so that the surface topography changes from the stepped topography to a smooth surface. Then, the chemical vapor deposition process is adopted to form a second sub-film layer to form the retardation layer 222.

In this embodiment, different retardation capabilities are realized by providing different materials above the first region 20a and the second region 20b. In other embodiments, different retardation capabilities are realized by providing the same material with different thicknesses above the first region and the second region.

Figure 3:
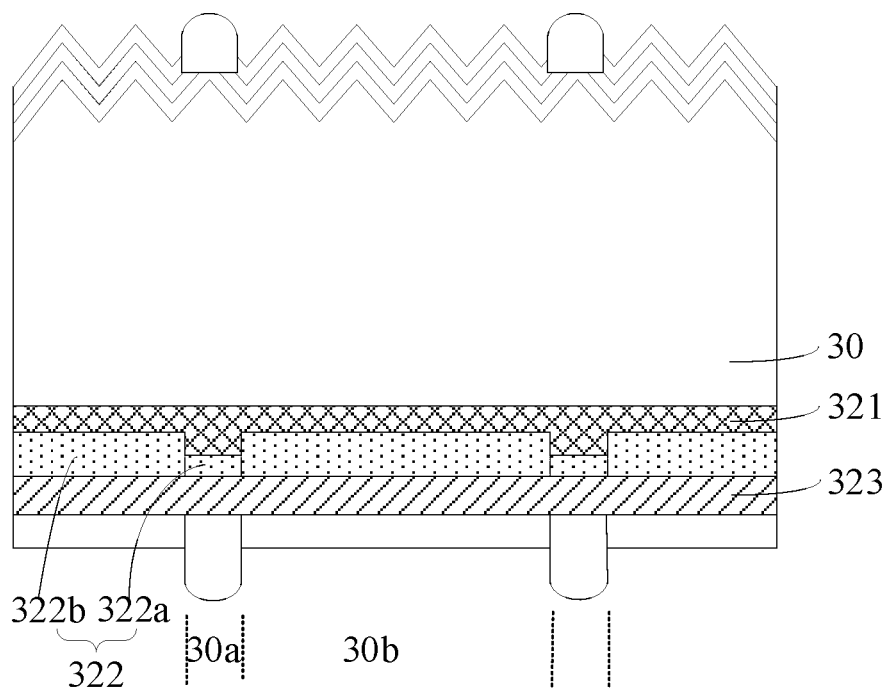
FIG. 3 is a schematic structural diagram of a solar cell according to an embodiment of the present disclosure.

Specifically, referring to FIG. 3, a retardation layer 322 is an intrinsic semiconductor layer. In a direction perpendicular to a surface of a substrate 30, a thickness of a first retardation sub-layer 322a is smaller than a thickness of a second retardation sub-layer 322b, and a surface of the first retardation sub-layer 322a away from the substrate 30 is flush with a surface of the second retardation sub-layer 322b away from the substrate 30. In this way, due to a retardation effect of an interface between the retardation layer 322 and a tunneling layer 321, under a condition of a free thermal diffusion, a maximum distance of a doped ion migrating in the first retardation sub-layer 322a is smaller than a maximum distance migrating in the second retardation sub-layer 322b.

In other words, when the doped ion may not continue to diffuse due to the interface barrier between the tunneling layer 321 and the retardation layer 322, it may be considered that a retardation capability of the second retardation sub-layer 322b is weaker than a retardation capability of the first retardation sub-layer 322a.

In addition, in a solar cell structure shown in FIG. 3, a structure of the tunneling layer 321 is complementary to a structure of the retardation layer 322, that is, a thickness of the tunneling layer 321 above a first region 30a is greater than a thickness of the tunneling layer 321 above a second region 30b, so as to improve the stability of the solar cell structure. In other structures, other materials, such as a bonding material, may also be added between the retardation layer 322 and the tunneling layer 321, so as to enhance a bonding performance of the retardation layer 322 and the tunneling layer 321 and ensure the stability of the solar cell structure.

In this embodiment, an arrangement of the retardation layer is beneficial to ensure that there is a large potential barrier between a field passivation layer and the substrate, so that the field passivation layer has a good band bending effect, thereby maintaining a selective transmission of a carrier, and also contributing to reducing a recombination loss caused by a migration of the doped ion to a surface of the substrate. Further, when a natural diffusion occurs due to a concentration difference, the second retardation sub-layer may bear the doped ion in the corresponding field passivation layer, thereby diluting a doping concentration of a corresponding part of the field passivation layer, further weakening a light absorption capacity of the corresponding part of the field passivation layer and improving a photoelectric conversion efficiency of the solar cell. Moreover, the doped ion diffused into the second retardation sub-layer may enhance the band bending effect and maintain the selective transmission of the carrier.

Figure 4:
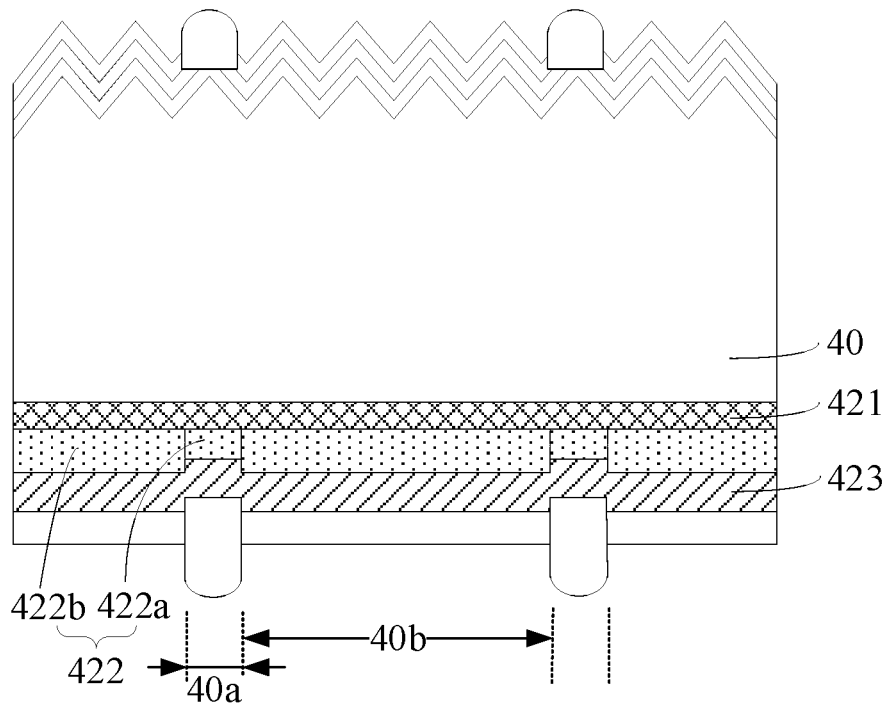
FIG. 4 is a schematic structural diagram of a solar cell according to an embodiment of the present disclosure.

In an embodiment, a surface of a first retardation sub-layer toward a substrate is flush with a surface of a second retardation sub-layer toward the substrate. The following will be described in detail below with reference to FIG. 4, which is a schematic structural diagram of a solar cell according to the present disclosure. Parts that are the same as or corresponding to the previous embodiments may refer to the corresponding description of the previous embodiments, and will not be repeated below. Referring to FIG. 4, a retardation layer 422 is an intrinsic semiconductor layer. In a direction perpendicular to a surface of a substrate 40, a thickness of a first retardation sub-layer 422a is smaller than a thickness of a second retardation sub-layer 422b, and a surface of the first retardation sub-layer 422a toward the substrate 40 is flush with a surface of the second retardation sub-layer 422b toward the substrate 40.

In addition, a field passivation layer 423 is complementary to the retardation layer 422, and a thickness of the field passivation layer 423 above a first region 40a is equal to a thickness of the field passivation layer 423 above a second region 40b in the direction perpendicular to the surface of the substrate 40.

In this embodiment, a surface doping concentration of a surface of the field passivation layer 423 above the first region 40a toward the substrate 40 is the same as a surface doping concentration of a surface of the field passivation layer 423 above the second region 40b toward the substrate 40. Under the same heat treatment process, since the thickness of the field passivation layer 423 above the first region 40a is relative thin, after a complete thermal diffusion of a doped ion, the surface doping concentration of the surface of the first retardation sub-layer 422a toward the substrate 40 is high, and the second retardation sub-layer 422b may accommodate more doped ions. In this way, the field passivation layer 423 and the retardation layer 422 above the first region 40a have good field passivation effect, while the field passivation layer 423 above the second region 40b has a low light absorption coefficient, thereby ensuring that the solar cell has a high conversion rate.

In addition, a doping concentration of a surface of the field passivation layer 423 above the first region 40a away from the substrate 40 is the same as a doping concentration of a surface of the field passivation layer 423 above the second region 40b away from the substrate 40.

In this embodiment, the material of the first retardation sub-layer 422a is the same as the material of the second retardation sub-layer 422b, and the difference of the retardation capacity therebetween is realized by the different thickness. In other embodiments, the material of the second retardation sub-layer is an intrinsic semiconductor, the material of the first retardation sub-layer is different from the material of the second retardation sub-layer, and the difference of the retardation capacity therebetween is realized by the different thickness and different material.

In this embodiment, an arrangement of the retardation layer is beneficial to ensure that there is a large potential barrier between the field passivation layer and the substrate, so that the field passivation layer has a good band bending effect, thereby maintaining a selective transmission of a carrier, and also contributing to reducing a recombination loss caused by a migration of the doped ion to the surface of the substrate. Further, when a natural diffusion occurs due to a concentration difference, the second retardation sub-layer may bear the doped ion in the corresponding field passivation layer, thereby diluting the doping concentration of a corresponding part of the field passivation layer, further weakening a light absorption capacity of the corresponding part of the field passivation layer and improving a photoelectric conversion efficiency of the solar cell. Besides, the doped ion diffused into the second retardation sub-layer may enhance the band bending effect and maintain the selective transmission of the carrier. Moreover, under the condition that a minimum thickness of an intermediate film layer remains unchanged, the field passivation layer above the first region is closer to the substrate, which is beneficial to further ensure the field passivation effect of the field passivation layer.

Correspondingly, in some embodiments, a method for preparing a solar cell is provided, which is used for preparing the above-mentioned solar cell.

FIGS. 5 to 8 are structural diagrams corresponding to each step of the method for preparing the solar cell according to the present disclosure. Referring to FIGS. 5 to 8, the method for preparing the solar cell includes the following steps.

Figure 5:
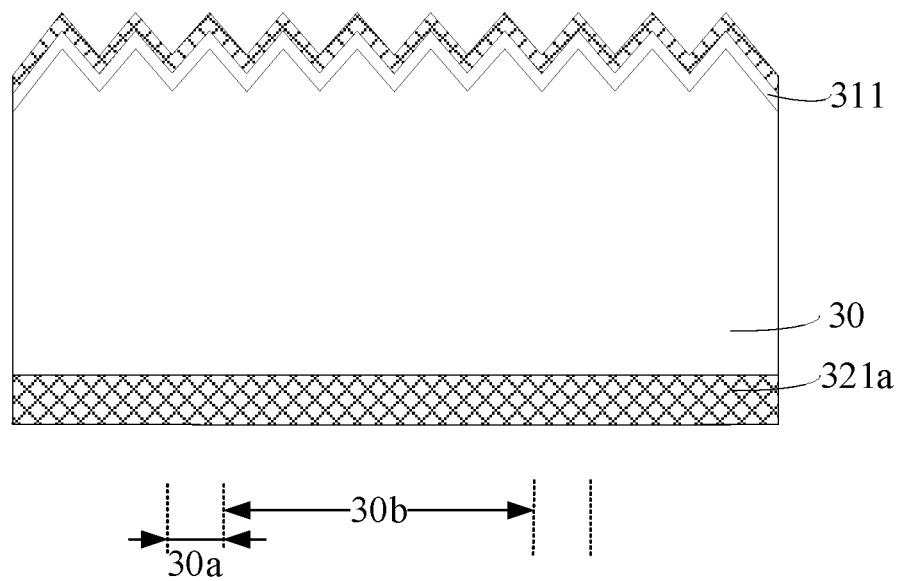
FIGS. 5 to 8 are schematic structural diagrams corresponding to each step of a method for preparing a solar cell according to an embodiment of the present disclosure.

Referring to FIG. 5, a substrate 30 is provided, and a tunneling film 321a is formed on a back surface (lower surface) of the substrate 30.

In this embodiment, the substrate 30 is an N-type silicon wafer, and the substrate 30 includes a first region 30a and a second region 30b. A second electrode formed subsequently is located above the first region 30a. Before forming the tunneling film 321a, a P-type doped ion is diffused on a front surface (upper surface) of the substrate 30 to form an emitter 311, and the doped ion includes a boron ion.

After diffusion, the back surface and an edge of the substrate need to be etched to remove a redundant PN junction, but a borosilicate glass formed by the diffusion of the doped ion in the front surface of the substrate 30 is retained. In other embodiments, the substrate is a P-type silicon wafer, and an N-type doped ion is used for diffusion doping. The doped ion includes a phosphorus ion, and a phosphosilicate glass is formed in the front surface of the substrate after diffusion of the doped ion.

In this embodiment, the material of the tunneling film 321a includes a silicon dioxide, and the tunneling film 321a may be formed by a thermal oxidation process. Specifically, after the emitter 311 is formed, an oxide layer is formed on the back surface of the substrate 30 and a surface of the emitter 311 away from the substrate 30, respectively. The oxide layer on the back surface serves as the tunneling film 321a.

Figure 6:
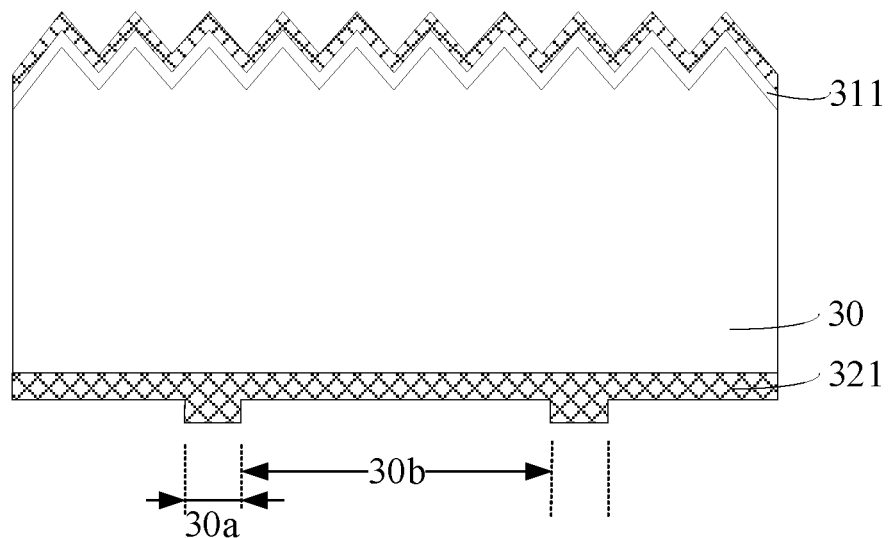

Referring to FIG. 6, the tunneling film 321a (refer to FIG. 5) is etched to form a tunneling layer 321.

In this embodiment, the tunneling film 321a is etched, so that a thickness of the tunneling layer 321 above the first region 30a is greater than a thickness of the tunneling layer 321 above the second region 30b. In other words, a top surface of the tunneling layer 321 above the second region 30b is lower than a top surface of the tunneling layer 321 above the first region 30a in a direction of the substrate 30 toward the tunneling layer 321.

Figure 7:
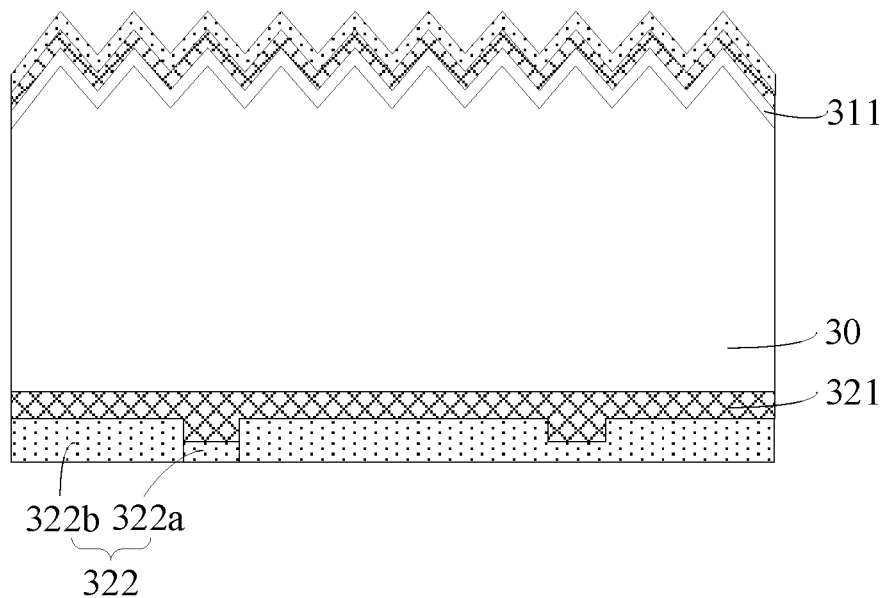

Referring to FIG. 7, a retardation layer 322 is formed.

In this embodiment, after the tunneling layer 321 is formed, a chemical vapor deposition or other processes is adopted to form a retardation film above the front surface and back surface of the substrate 30, and the retardation film above the back surface of the substrate 30 is planarized to form the retardation layer 322 above the back surface of the substrate 30. The retardation layer 322 is far away from a flush surface of the surface of the substrate 30.

Herein, the retardation layer 322 is complementary to the tunneling layer 321. A thickness of the retardation layer 322 above the first region 30a is smaller than a thickness of the retardation layer 322 above the second region 30b in a direction perpendicular to the surface of the substrate 30.

Figure 8:
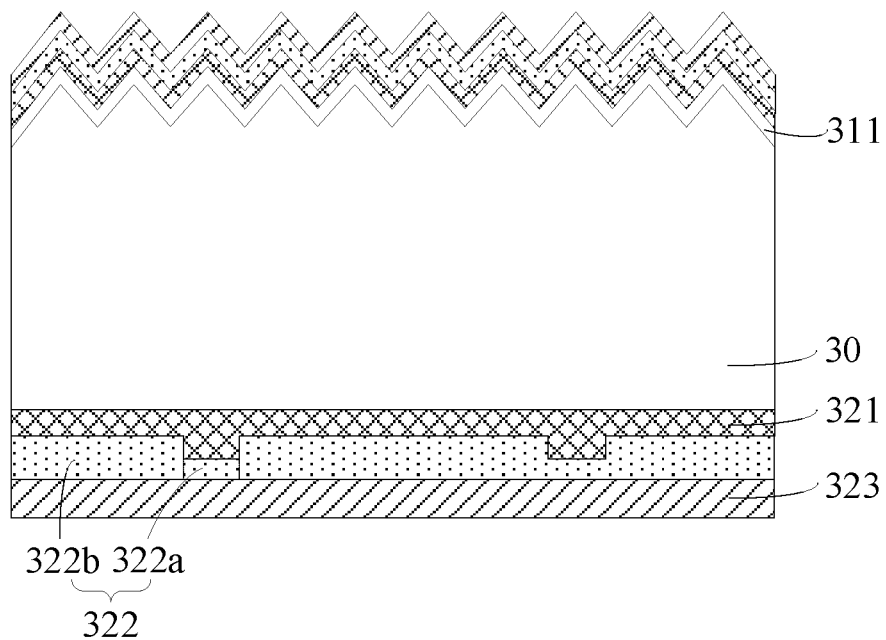

Referring to FIG. 8, a field passivation layer 323 is formed.

In this embodiment, after the retardation layer 322 is formed, the chemical vapor deposition process is adopted to form a polycrystalline silicon layer above the front surface and back surface of the substrate 30, and an ion implantation process is performed on the polycrystalline silicon layer above the back surface of the substrate 30 to form the field passivation layer 323 above the back surface of the substrate 30.

In this embodiment, in the direction perpendicular to the surface of the substrate 30, the field passivation layer 323 has a uniform thickness and uniformly covers the surface of the retardation layer 322 away from the substrate 30. In addition, a surface doping concentration of a surface of the field passivation layer 323 above the first region 30a toward the substrate 30 is the same as a surface doping concentration of a surface of the field passivation layer 323 above the second region 30b toward the substrate 30. Alternatively, an average doping concentration of a surface layer of the field passivation layer 323 above the first region 30a away from substrate 30 is the same as an average doping concentration of a surface layer of the field passivation layer 323 above the second region 30b away from the substrate 30.

It should be noted that, in order to reduce implantation energy and implantation damage during the ion implantation of the polycrystalline silicon layer, a surface layer of the polycrystalline silicon layer away from the substrate 30 is generally selected to be heavily doped. After being heavily doped, the doped ion located in the surface layer may diffuse to other regions due to the concentration difference and distribute throughout the polycrystalline silicon layer. When the average doping concentration of the surface layer of the field passivation layer 323 away from the substrate 30 in different regions is the same, and the diffusion conditions and diffusion path lengths are the same, the surface doping concentration of the surface of the field passivation layer 323 toward the substrate 30 in different regions is the same.

After forming the field passivation layer 323, the oxide layer, the retardation film and the polycrystalline silicon layer on the front surface of the substrate 30 are removed, and a first passivation film, an antireflection film and a first electrode which are sequentially disposed are formed on the front surface of the substrate 30. A second passivation film and a second electrode are formed above the back surface of the substrate 30. A material of the first passivation film may be the same as a material of the second passivation film, and both may be formed in the same forming process.

In this embodiment, since a thickness of the second retardation sub-layer 322b is relative thick, the second retardation sub-layer 322b may accommodate more doped ions, and the second retardation sub-layer 322b may more effectively retard a migration of the doped ion. Besides, the second retardation sub-layer 322b may effectively dilute the doping concentration of the field passivation layer 323 above the second region 30b, thereby reducing a light absorption capacity of the field passivation layer 323 above the second region 30b and improving a conversion efficiency of the solar cell.

In an embodiment, a method for preparing a solar cell is further provided. Different from the previous method embodiment, in this embodiment, a surface of a first retardation sub-layer above a first region toward a substrate is flush with a surface of a second retardation sub-layer above a second region toward the substrate. The following will be described in detail below with reference to FIGS. 9 to 10, which are schematic structural diagrams of the solar cell according to the present disclosure. Parts that are the same as or corresponding to the previous embodiment may refer to the corresponding description of the previous embodiment, and will not be repeated below.

Figure 9:
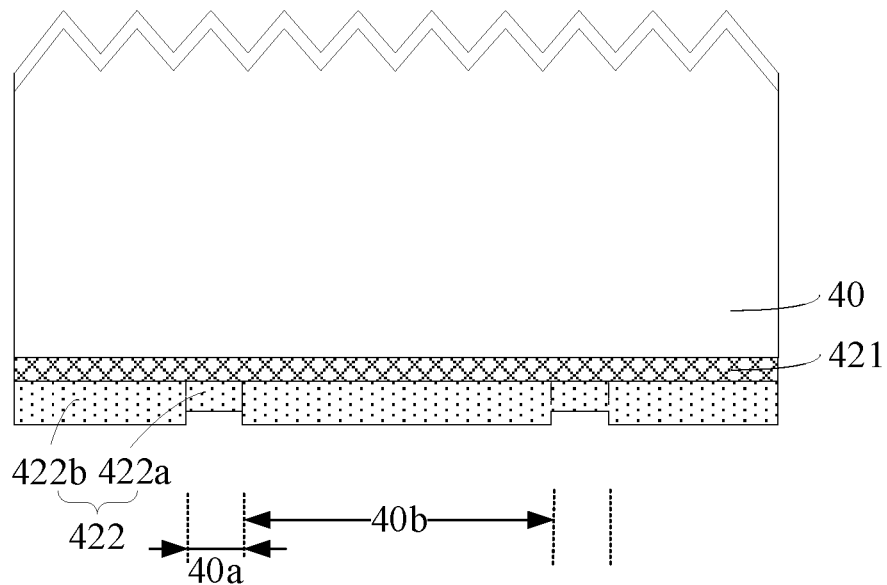
FIGS. 9 to 10 are schematic structural diagrams corresponding to each step of a method for preparing a solar cell according to an embodiment of the present disclosure.

Referring to FIG. 9, after a tunneling layer 421 is formed, a retardation layer 422 is formed.

In this embodiment, the tunneling layer 421 has a uniform thickness in a direction perpendicular to a back surface of the substrate 40. After the tunneling layer 421 is formed, a retardation film with a uniform thickness and uniformly covering a surface of the tunneling layer 421 is formed, and the retardation film is patterned and etched so that a thickness of the retardation film above a first region 40a is smaller than a thickness of the retardation film above a second region 40b, and the remaining retardation film serves as the retardation layer 422.

Figure 10:
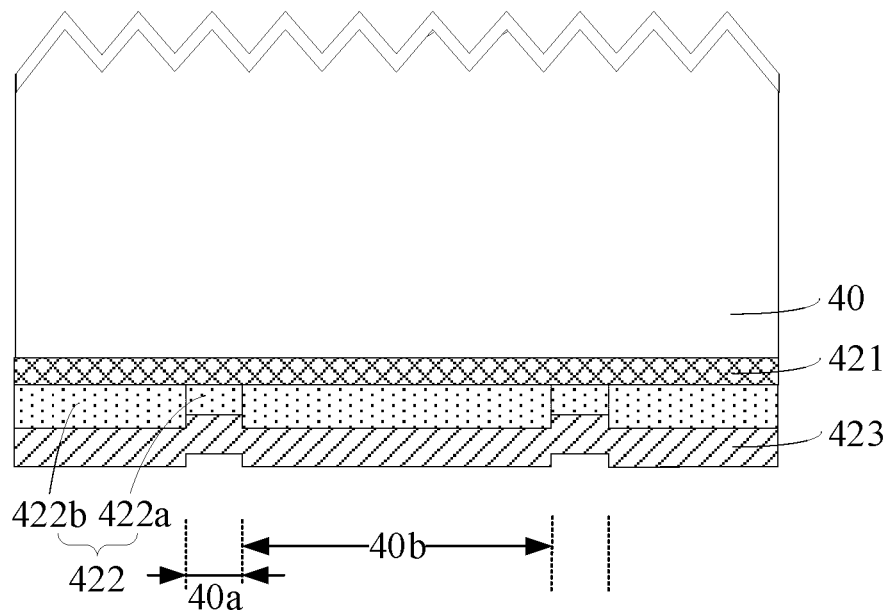

Referring to FIG. 10, a field passivation layer 423 is formed.

In this embodiment, in a direction of the substrate 40 toward the retardation layer 422, a top surface of the retardation layer 422 above the first region 40a is lower than a top surface of the retardation layer 422 above the second region 40b; A thickness of the field passivation layer 423 above the first region 40a is equal to a thickness of the field passivation layer 423 above the second region 40b.

In this embodiment, the specific process steps for forming the field passivation layer 423 include: forming a polycrystalline silicon layer covering the surface of the retardation layer 422, and performing a planarization process on the polycrystalline silicon layer so that the polycrystalline silicon layer has a flush surface far away from the substrate 40; etching the polycrystalline silicon layer with a mask so that a thickness of the polycrystalline silicon layer above the first region 40a is the same as a thickness of the polycrystalline silicon layer above the second region 40b; and performing an ion implantation process on a surface layer of the polycrystalline silicon layer away from the substrate 40.

In other embodiments, a deposition process may also be directly performed to form field passivation layers with the same thickness in different regions.

After performing the ion implantation process, in the direction of the substrate 40 toward the field passivation layer 423, an average doping concentration of a top layer of the field passivation layer 423 above the first region 40a is equal to an average doping concentration of a top layer of the field passivation layer 423 above the second region 40b. After further diffusion, a surface doping concentration of a bottom surface of the field passivation layer 423 above the first region 40a is equal to a surface doping concentration of a bottom surface of the field passivation layer 423 above the second region 40b.

In this embodiment, since a first retardation sub-layer 422a is relative thin, a surface doping concentration of a surface of the first retardation sub-layer 422a toward the substrate 40 is high after a heat treatment process, which is beneficial to ensure that there is a large potential barrier between the first retardation sub-layer 422a and the substrate 40, and ensure that the first retardation sub-layer 422a and the field passivation layer 423 above the first region 40a have a strong band bending ability, thereby ensuring an effective transmission of a carrier and maintaining a selective transmission of the carrier.

Those skilled in the art should appreciate that the aforementioned embodiments are specific embodiments for implementing the present disclosure. In practice, however, various changes may be made in the forms and details of the specific embodiments without departing from the spirit and scope of the present disclosure. Any person skilled in the art may make their own changes and modifications without departing from the spirit and scope of the present disclosure, so the protection scope of the present disclosure shall be subject to the scope defined by the claims.

What is claimed is:

1. A solar cell, comprising:
a substrate;
an emitter, a first passivation film, an antireflection film and a first electrode that are disposed on an upper surface of the substrate;
a tunneling layer, a retardation layer, a field passivation layer, a second passivation film and a second electrode that are disposed on a lower surface of the substrate;
wherein the retardation layer is configured to retard migration of doped ions from the field passivation layer to the substrate, and the retardation layer includes:
a first retardation sub-layer aligned with a projection of the second electrode, and
a second retardation sub-layer misaligned with a projection of the second electrode, wherein at least the second retardation sub-layer is an intrinsic semiconductor layer, and a material of the intrinsic semiconductor layer is the same as a material of the field passivation layer;
wherein a thickness of the first retardation sub-layer is smaller than a thickness of the second retardation sub-layer in a direction perpendicular to the lower surface of the substrate;
wherein the first retardation sub-layer includes at least two film layers, the at least two film layers includes a first surface layer toward the tunneling layer and a second surface layer toward the field passivation layer; a material of the first surface layer is a metal, and a material of the second surface layer is a compound generated from a reaction with the metal.

2. The solar cell according to claim 1, wherein a thickness of the second retardation sub-layer is less than or equal to 20 nm in the direction perpendicular to the lower surface of the substrate.

3. The solar cell according to claim 1, wherein the intrinsic semiconductor material includes at least one of intrinsic polycrystalline silicon, intrinsic amorphous silicon and intrinsic microcrystalline silicon.

4. The solar cell according to claim 1, wherein an average doping concentration of a surface layer of the field passivation layer towards the retardation layer is between $1E+19/cm^3$ to $1E+21/cm^3$, and the thickness of the second retardation sub-layer is between 0.5 nm to 20 nm.

5. The solar cell according to claim 1, wherein a surface doping concentration of a surface of the field passivation layer away from the retardation layer is between $1E+20/cm^3$ to $1E+22/cm^3$, and a ratio of a thickness of the field passivation layer to the thickness of the second retardation sub-layer in the direction perpendicular to the lower surface of the substrate is between 5 to 100.

6. The solar cell according to claim 1, wherein a material type of the first retardation sub-layer is different from a material type of the field passivation layer.

7. The solar cell according to claim 1, wherein a material of the first passivation film includes at least one of silicon nitride, silicon oxynitride, silicon carbonitride, titanium oxide, hafnium oxide, and aluminum oxide; a material of the second passivation film includes at least one of silicon nitride, silicon oxynitride, silicon carbonitride, titanium oxide, hafnium oxide, and aluminum oxide.

8. A solar cell, comprising:
a substrate;
an emitter, a first passivation film, an antireflection film and a first electrode that are disposed on an upper surface of the substrate;
a tunneling layer, a retardation layer, a field passivation layer, a second passivation film and a second electrode that are disposed on a lower surface of the substrate;
wherein the retardation layer is configured to retard migration of doped ions from the field passivation layer to the substrate, and the retardation layer includes:
a first retardation sub-layer aligned with a projection of the second electrode, and
a second retardation sub-layer misaligned with a projection of the second electrode, wherein at least the second retardation sub-layer is configured as an intrinsic semiconductor layer, and a material of the intrinsic semiconductor layer is the same as a material of the field passivation layer;
wherein a retardation capability of the second retardation sub-layer is weaker than a retardation capability of the first retardation sub-layer; a retardation capability of a particular retardation sub-layer is related to a longest distance that a doped ion that undergoes thermal diffusion is able to migrate from the field passivation layer towards the substrate through the particular retardation sub-layer; and the shorter the longest distance that the doped ion undergoing thermal diffusion migrates, the stronger the retardation capability of the retardation layer;

wherein the first retardation sub-layer includes at least two film layers, the at least two film layers includes a first surface layer toward the tunneling layer and a second surface layer toward the field passivation layer; a material of the first surface layer is a metal, and a material of the second surface layer is a compound generated from a reaction with the metal.

9. A method for preparing a solar cell, comprising:
providing a substrate;
forming an emitter, a first passivation film, an antireflection film and a first electrode on an upper surface of the substrate;
forming a tunneling layer, a retardation layer, a field passivation layer, a second passivation film and a second electrode on a lower surface of the substrate;
wherein the retardation layer is configured to retard a migration of doped ions from the field passivation layer to the substrate, and the retardation layer includes: a first retardation sub-layer aligned with a projection of the second electrode, and a second retardation sub-layer misaligned with a projection of the second electrode, wherein at least the second retardation sub-layer is configured as an intrinsic semiconductor layer, and a material of the intrinsic semiconductor layer is the same as a material of the field passivation layer;
wherein a thickness of the first retardation sub-layer is smaller than a thickness of the second retardation sub-layer in a direction perpendicular to the lower surface of the substrate;
wherein the first retardation sub-layer includes at least two film layers, the at least two film layers includes a first surface layer toward the tunneling layer and a second surface layer toward the field passivation layer; a material of the first surface layer is a metal, and a material of the second surface layer is a compound generated from a reaction with the metal.

10. The method according to claim 9, wherein a thickness of the second retardation sub-layer is less than or equal to 20 nm in the direction perpendicular to the lower surface of the substrate.

11. The method according to claim 9, wherein the intrinsic semiconductor material includes at least one of intrinsic polycrystalline silicon, intrinsic amorphous silicon and intrinsic microcrystalline silicon.

12. The method according to claim 9, wherein an average doping concentration of a surface layer of the field passivation layer towards the retardation layer is between $1E+19/cm^3$ to $1E+21/cm^3$ and the thickness of the second retardation sub-layer is between 0.5 nm to 20 nm.

13. The method according to claim 9, wherein a surface doping concentration of a surface of the field passivation layer away from the retardation layer is between $1E+20/cm^3$ to $1E+22/cm^3$ and a ratio of a thickness of the field passivation layer to the thickness of the second retardation sub-layer in the direction perpendicular to the lower surface of the substrate is between 5 to 100.

14. The method according to claim 9, wherein a material type of the first retardation sub-layer is different from a material type of the field passivation layer.

15. The method according to claim 9, wherein a material of the first passivation film includes at least one of silicon nitride, silicon oxynitride, silicon carbonitride, titanium oxide, hafnium oxide, and aluminum oxide; a material of the second passivation film includes at least one of silicon nitride, silicon oxynitride, silicon carbonitride, titanium oxide, hafnium oxide, and aluminum oxide.

* * * * *